(12) United States Patent
Wang

(10) Patent No.: US 11,585,883 B2
(45) Date of Patent: Feb. 21, 2023

(54) METHOD AND APPARATUS FOR HIGH VALUE MAGNETIC RESONANCE IMAGING

(71) Applicant: University of Cincinnati, Cincinnati, OH (US)

(72) Inventor: Jinghua Wang, Mason, OH (US)

(73) Assignee: University of Cincinnati, Cincinnati, OH (US)

(*) Notice: Subject to any disclaimer, the term of this patent is extended or adjusted under 35 U.S.C. 154(b) by 87 days.

(21) Appl. No.: 17/223,164

(22) Filed: Apr. 6, 2021

(65) Prior Publication Data

US 2021/0223346 A1 Jul. 22, 2021

Related U.S. Application Data

(62) Division of application No. 16/200,918, filed on Nov. 27, 2018, now Pat. No. 10,996,304.

(60) Provisional application No. 62/591,311, filed on Nov. 28, 2017.

(51) Int. Cl.
*G01R 31/00* (2006.01)
*G01R 33/56* (2006.01)
*G01R 33/54* (2006.01)

(52) U.S. Cl.
CPC ....... *G01R 33/5608* (2013.01); *G01R 33/543* (2013.01); *G01R 33/56* (2013.01)

(58) Field of Classification Search
USPC .......................... 324/305–310, 316–317, 322
See application file for complete search history.

(56) References Cited

U.S. PATENT DOCUMENTS

| | | |
|---|---|---|
| 8,076,936 B2 | 12/2011 | Borthakur et al. |
| 8,504,392 B2 | 8/2013 | Saria et al. |
| 8,664,954 B2 | 3/2014 | Hetzer et al. |
| 9,286,672 B2 | 3/2016 | Madabhushi et al. |
| 9,339,239 B2 | 5/2016 | Wang et al. |
| 9,430,616 B2 | 8/2016 | Duftler et al. |

(Continued)

FOREIGN PATENT DOCUMENTS

| | | |
|---|---|---|
| WO | 2016145355 A1 | 9/2016 |
| WO | 2017147418 A1 | 8/2017 |

OTHER PUBLICATIONS

Mayo, R.C., et al., "The Economic and Social Value of an Image Exchange Network: A Case for the Cloud". Journal of the American College of Radiology, 2017. 14(1): p. 130-134.

(Continued)

*Primary Examiner* — Vincent Q Nguyen
(74) *Attorney, Agent, or Firm* — Dinsmore & Shohl

(57) ABSTRACT

A method and system for optimizing a magnetic resonance imaging (MRI) protocols to improve MRI value are described herein. An example method includes selecting an imaging sequence, selecting at least one objective function from a plurality of objective functions, simulating a relationship between controllable acquisition variables and the objective functions, trade-offing the influence of the controllable acquisition variables for MRI value in whole k-space acquisition to determine optimal acquisition condition, acquiring at least one MR image using the optimal acquisition condition, receiving or estimating outcomes related to the at least one MR image, and evaluating an MR image value for the MR image based on the outcomes.

8 Claims, 11 Drawing Sheets

(56) References Cited

U.S. PATENT DOCUMENTS

| | | |
|---|---|---|
| 2016/0055304 A1 | 2/2016 | Russell et al. |
| 2018/0045799 A1 | 2/2018 | Wang et al. |
| 2018/0315182 A1 | 11/2018 | Rapaka et al. |
| 2019/0041481 A1* | 2/2019 | Subbarao ........... G01R 33/3415 |

OTHER PUBLICATIONS

Ellingson, B.M., et al., "Consensus Recommendations for a Standardized Brain Tumor Imaging Protocol in Clinical Trials". Neuro-Oncology, 2015. 17(9): p. 1188-1198.

Murrell, D.H., et al., "Understanding Heterogeneity and Permeability of Brain Metastases in Murine Models of HER2-Positive Breast Cancer Through Magnetic Resonance Imaging: Implications for Detection and Therapy". Translational Oncology, 2015. 8(3): p. 176-184.

Hennig, J., M. Weigel, and K. Scheffler, "Calculation of Flip Angles for Echo Trains with Predefined Amplitudes with the Extended Phase Graph (EPG)-Algorithm: Principles and Applications to Hyperecho and TRAPS Sequences". Magnetic Resonance in Medicine, 2004. 51(1): p. 68-80.

* cited by examiner

METHOD AND APPARATUS FOR HIGH VALUE MAGNETIC RESONANCE IMAGING

CROSS-REFERENCE TO RELATED APPLICATIONS

This application is a divisional application of U.S. patent application Ser. No. 16/200,918 filed on Nov. 27, 2018 which claims priority to U.S. Provisional Application No. 62/591,311 filed on Nov. 28, 2017, the entire contents of which are herein incorporated by reference.

FIELD

The present invention relates to method and apparatus for improving value of magnetic resonance imaging (MRI) via improved MRI efficiency, reduced MRI cost and improved outcomes.

BACKGROUND

Magnetic Resonance Imaging (MRI) is one of the most important modern medical imaging modalities. It has far less risk of side effects than most other imaging modalities such as radioscopy with x-rays or computed tomography because patients and medical personnel are not subjected to ionizing radiation exposure in the procedure. The use of MRI has grown very fast. Every year, more than 40 million MRI scans are performed in the United States; more than 70 million MRI scans are performed worldwide. Doctors often recommend MRI for the diagnosis of various diseases, such as tumors, strokes, heart problems, and spine diseases. A high-quality scan is important for maximizing diagnostic sensitivity and accuracy. Generally, high quality images are characterized by high signal to noise ratio (SNR), high contrast between normal and pathological tissues, low levels of artifacts, and appropriate spatial-temporal resolution.

In order to obtain a detectable MR signal, the object/subject examined is positioned in a homogeneous static magnetic field so that the object's nuclear spins generate net magnetization oriented along the static magnetic field. The net magnetization is rotated away from the static magnetic field using a radio frequency (RF) excitation field with the same frequency as the Larmor frequency of the nucleus. The angle of rotation is determined by the field strength of the RF excitation pulse and its duration. In the end of the RF excitation pulse, the nuclei, in relaxing to their normal spin conditions, generate a decaying signal (the "MR signal") at the same radio frequency as the RF excitation. The MR signal is picked up by a receive coil, amplified and processed. The acquired measurements, which are collected in the spatial frequency domain, are digitized and stored as complex numerical values in a "k-space" matrix. An associated MR image can be reconstructed from the k-space data, for example, by an inverse 2 dimensional (2D) or 3 dimensional (3D) fast Fourier transformation (FFT) from the raw k-space.

Recently, health care delivery in the United States is to transfer from traditional volume-driven to value-driven care. The healthcare value is defined as a metric which equals health outcomes of the patients divided by costs of delivering the outcomes. That is, the healthcare value is defined as the quality of patient outcome per unit of cost. The healthcare outcomes include mortality, safety of care, readmissions, effectiveness of care, efficient use of medical imaging, and so on. Improving healthcare outcomes mainly means improving the health of patients and the patient experience, and reducing costs. The healthcare cost relies on various factors such as report turnaround time, equipment utilization rates and downtimes, access and wait times, and staffing efficiency. The goal of value-based MRI is to improve healthcare quality of the patients and reduce the overall costs of care by improved MRI techniques, operation pipelines and utilizations.

U.S. Pat. No. 8,076,936 B2 to Borthakur A et al. discloses methods and systems for shortening scan time by as much as 3- or 4-fold or more over conventional MRI scanning methods in the combination of T1ρ preparation and acquisition of multiple lines of k-space.

U.S. Pat. No. 8,504,392 B2 to Saria S et al. discloses methods and systems to mine structured clinical event data in an electronic health record system to determine patient outcomes.

U.S. Pat. No. 8,664,954 B2 to Hetzer S et al. discloses methods and systems for improved imaging contrast and/or shortened acquisition time via the two segments in k-space sampling which are sampled along trajectories beginning with a central k-space line through a k-space center and continuing to opposite k-space borders of the two segments and wherein one central k-space line is sampled in both of the two k-space segments.

U.S. Pat. No. 9,286,572 B2 to Madabhushi A and Basavanhally A discloses a method and apparatus for predicting disease outcome using a multi-field-of-view scheme based on image-based features from multi-parametric heterogeneous images.

U.S. Pat. No. 9,339,239 B2 to Wang J et al. discloses a method and apparatus to optimize the objective function for the center of k-space based on a pre-determined k-space strategy to improve the image quality and efficiency. The cost of MRI exam is improved by the increased efficiency without the penalty of increased other costs. The method mainly focuses on 3 dimensional $T_1$-weighted sequence acquisition.

U.S. Pat. No. 9,430,616 B2 to Duftler M J et al. discloses methods and systems for data analysis to identify treatment pathways correlated with the patient outcomes.

International Patent Publication No. WO 2016/145355 A1 to Wang J et al. discloses a method and apparatus to optimize the objective function through simulating Bloch equation or the solution of Bloch equation. The image quality and its efficiency was improved by shortening acquisition train length and optimal imaging parameters. The cost of MRI exam is improved by the increased efficiency without the penalty of increased other costs. The method mainly focuses on $T_1$-weighted sequence with shortened acquisition train length.

International Patent Publication No. WO 2017/147418 A1 to Wang J discloses a method and apparatus to optimize the objective function through simulating Bloch equation or the solution of Bloch equation with administration of contrast agent. The cost of MRI exam is increased by the increased efficiency without the penalty of increased other costs. The method mainly focuses on $T_1$-weighted sequence for contrast-enhanced imaging.

International Patent Application No. PCT/US2018/057007 to Wang J discloses a method and apparatus with optimal variable flip angels to improve the image quality and efficiency. The cost of MRI exam is decreased by the increased efficiency without the penalty of increased other costs. The method mainly focuses on the echo train techniques for both $T_1$-weighted and $T_2$-weighted sequences which involve acquiring plural, differently encoded, echo signals after one RF excitation. (e.g., using gradient refocusing in echo planar imaging (EPI), RF refocusing in rapid acquisition with relaxation enhancement (RARE), or using both RF and gradient refocusing in gradient and spin echo imaging (GRASE)). But this method does not integrate with image interpretation for further improvement of MRI value.

U.S. Patent Application Publication No. 2018/0315182 to Rapaka S et al. discloses methods and systems for assessment and/or outcome determination in a medical system based on a large amount of information.

SUMMARY

Most of patents mentioned above focus on improving MRI value via the improvement of MRI efficiency. In this disclosure, a method and apparatus is disclosed to acquire the high quality images based on integration of MRI image acquisition, image processing, and interpretation for the improvement of MRI value. The method is available for any type of MRI sequence A method and system for improving MRI value disclosed herein are available for any sequences, including spin echo and gradient echo sequences before these sequence do not reach a steady state of magnetization. It is available not only for the sequences mentioned above, but also for echo train acquisition such as magnetization preparation rapid gradient echo sequence (IR-GRE), magnetization preparation fast spin echo sequences, gradient- and spin-echo (GRASE) sequences.

In one embodiment, a method for improvement of magnetic resonance (MR) image value for a magnetic resonance imaging (MRI) protocol. The method includes selecting an imaging sequence, selecting at least one objective function from a plurality of objective functions, simulating a relationship between controllable acquisition variables and the objective functions, trade-offing the influence of the controllable acquisition variables for MRI value in whole k-space acquisition to determine optimal acquisition condition, acquiring at least one MR image using the optimal acquisition condition, receiving or estimating outcome from the at least one MR image, and evaluating MR image value.

In another embodiment, a method for improvement of magnetic resonance (MR) image value for a magnetic resonance imaging (MRI) protocol. The method includes extracting quantitative features from the at least one MR image, normalizing features to unit volume, normalizing features to unit scan time, quantify the cost, receiving the outcome, and quantifying MR image value from outcome and cost.

In another embodiment, a magnetic resonance imaging (MRI) system is provided. The MRI system includes a magnetic field generating unit configured to apply a plurality of RF pulses with a variable flip angle to a target area in the object, a receiver configured to receive MR signals from the target area, a processing unit, a system memory, and machine readable instructions stored in the system memory. The machine readable instructions, when executed by the processing unit, cause the processing unit to: select an imaging sequence, select at least one objective function from a plurality of objective functions, simulate a relationship between controllable acquisition variables and the objective functions, trade-off the influence of the controllable acquisition variables for MRI value in whole k-space acquisition to determine optimal acquisition condition, acquire at least one MR image using the optimal acquisition condition, receive or estimate outcome from the at least one MR image, and evaluate MR image value.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

1. Definition

Figure 1:
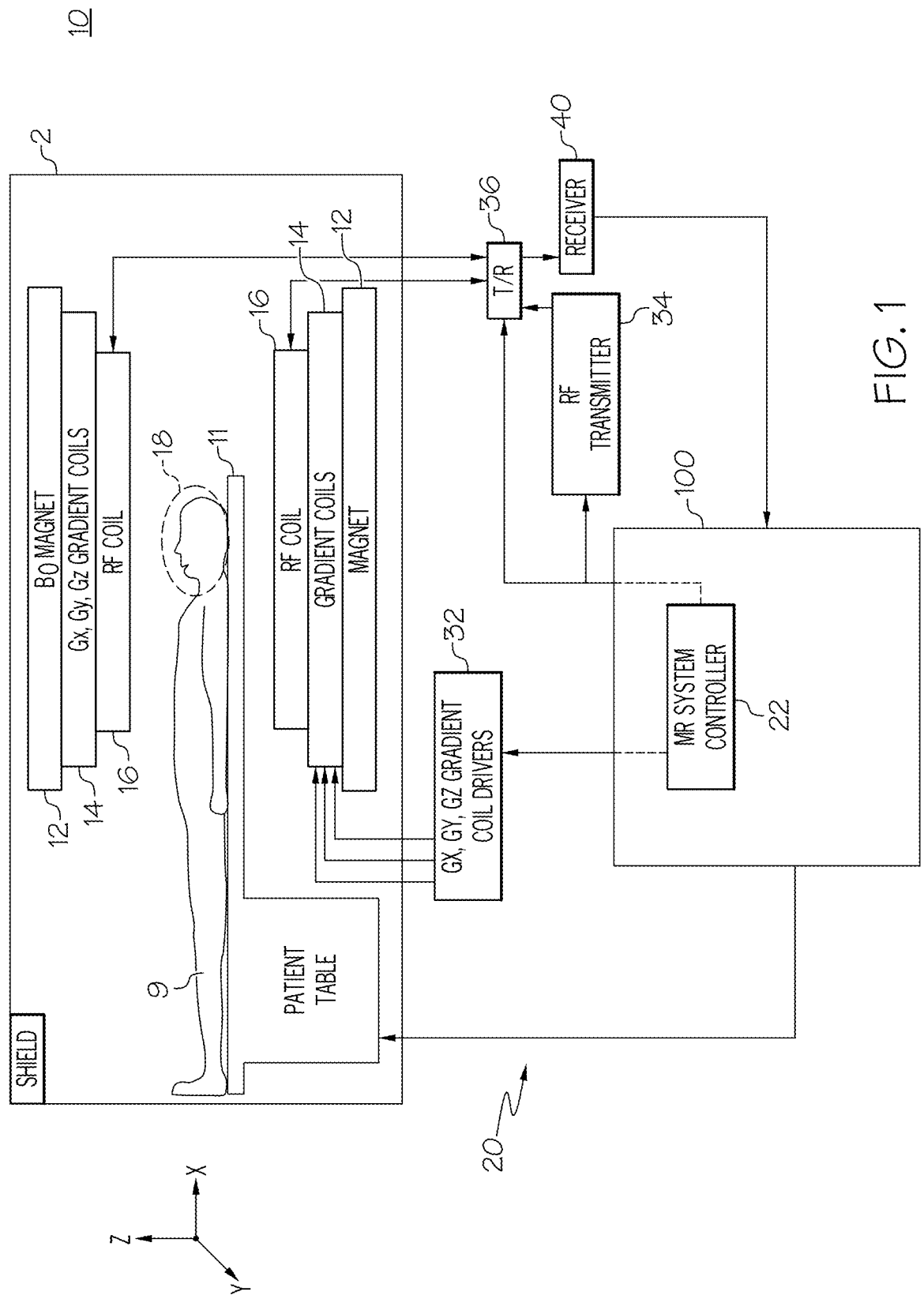
FIG. 1 is a diagram illustrating an example MRI system.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not.

While implementations will be described for optimizing MRI scanner settings (also referred to herein as "basic scanner settings"), MRI protocols, variable flip angle, k-space strategy, and/or imaging parameters with regard to MRI modalities, it will become evident to those skilled in the art that the implementations are not limited thereto, but are applicable to other image modalities such as, computed tomography, for example. Additionally, this disclosure contemplates that MU modalities include MRI techniques with administration of contrast agents, for example, contrast enhanced MR angiography. This disclosure contemplates that the images obtained using the techniques described herein can be directly employed in at least one of diagnosing diseases, monitoring prognosis and therapeutic responses, conducting treatment plans, and improving quantification of MRI. For example, the techniques described herein can be used for the diagnoses of specific diseases such as the standardization of the MU protocol in The Alzheimer's Disease Neuroimaging Initiative. Additionally, the techniques described herein are optionally applicable to a group of individuals in a similar pathophysiological situation.

The term "value" and variations thereof as used herein is defined as:

$$\text{Value} = \frac{\text{healthcare outcomes}}{\text{healthcare costs for deliving the outcomes}} \quad \text{Equation (1)}$$

where the healthcare outcomes are the full set of health results for a patient's condition over the care cycle, and healthcare costs are the total costs of care for a patient's condition over the care cycle. The healthcare costs include costs associated with resources consumed by a specific object or medical intervention. For example, the healthcare costs include the cost for physician services, technician services, imaging exams, diagnostic tests, and hospitalization expenses. The healthcare costs are affected by MRI scanning time per image. The healthcare costs may increase if the MRI scanning time per image increases, and decrease if the MRI scanning time per image decreases.

The term "MRI efficiency" and variation thereof as used here are related to an amount of time to acquire MRI images. Particularly, MRI efficiency indicates the ability to avoid wasting time in acquiring the image with a desired image quality or pre-determined spatial resolution. The term "high efficiency" and variation thereof as used here indicated the ability to acquire the image with a desired image quality or pre-determined spatial resolution within a relatively short scan time. In general, efficiency is a measurable concept, quantitatively determined by the ratio of image quality to a total scan time and a volume. Herein, the volume is defined as a size of a voxel in the images. MRI efficiency includes at least one of signal intensity efficiency, signal-to-noise ratio efficiency, contrast efficiency, contrast-to-noise ratio efficiency, but not limited to, lesion enhancement efficiency, lesion enhancement-to-noise ratio efficiency and their variations.

The term "signal intensity efficiency" and variation thereof as used here indicate signal intensity of the acquired image per unit time and volume (i.e., signal intensity per unit time and volume).

The term "signal-to-noise ratio efficiency" and variation thereof as used here indicate signal-to-noise ratio of the acquired image per unit time and volume (i.e., signal-to-noise ratio per unit time and volume).

The term "contrast efficiency" and variation thereof as used here indicate contrast of the acquired image per unit time and volume (i.e., contrast per unit time and volume).

The term "contrast-to-noise ratio efficiency" and variation thereof as used here indicate contrast-to-noise ratio of the acquired image per unit time and volume (i.e., contrast-to-noise ratio per unit time and volume).

The term "lesion enhancement efficiency" and variation thereof as used here indicate that lesion enhancement of the acquired image per unit time and volume (i.e., lesion enhancement per unit time and volume).

The term "lesion enhancement-to-noise ratio efficiency" and variation thereof as used here indicate that lesion enhancement-to-noise ratio of the acquired image per unit time and volume (i.e., lesion enhancement-to-noise ratio per unit time and volume).

SNR is used in imaging as a physical measure of the sensitivity of an imaging system which is defined as:

$$\text{SNR} = \mu_{signal}/\sigma_{background} \quad \text{Equation (2)}$$

where $\mu_{signal}$ is the average signal intensity of region of interest (ROI). $\sigma_{background}$ is the standard deviation of signal intensity of background region.

The SNR efficiency, $\text{SNR}_{eff}$, is used to quantitatively evaluate image quality and efficiency. It is defined as SNR per square root total scan time (TA), is given by Equation 3 below.

$$\text{SNR}_{eff} = \text{SNR}/\sqrt{TA} \quad \text{Equation (3)}$$

A single type of tissue may have different signal intensities because of signal inhomogeneity caused by non-uniform transmit field and receive sensitivity. Thus, SNR of the single tissue may not be the best metric to evaluate image quality sometimes. Instead, global SNR can be used as an indicator to evaluate the image quality at that case, avoiding the error caused by signal inhomogeneity.

As used herein, contrast is defined as:

$$\text{Contrast} = \mu_A - \mu_B, \quad \text{Equation (4)}$$

where $\mu_A$ and $\mu_B$ are the average signal value of regions A and B, respectively. It should be understood that other definitions of contrast can also be used as the objective function, such as Weber contrast and Michelson contrast, for example.

CNR is used as a metric to determine image quality, and is defined as:

$$\text{CNR} = \text{Contrast}/\sigma_{background} \quad \text{Equation (5)}$$

The CNR efficiency is defined as CNR per square root of total scan time (TA) as given by Equation 6 below:

$$\text{CNR}_{eff} = \text{CNR}/\sqrt{TA}; \quad \text{Equation (6)}$$

The enhancement of lesion (EL) (also referred to herein as a lesion enhancement metric) is used to describe the change in signal intensity of a lesion (also referred to herein as lesion tissue) in images acquired before and after the administration of contrast agent, respectively. It is noted that Gd-related $T_2$-shortening generally reduces signal and works against the $T_1$-related signal enhancement. In order to simultaneously cover both $T_1$ contrast agent and $T_2^*$ contrast agent described herein, the lesion enhancement metric is absolute MR signal change before and after the administration of contrast agent, that is, the lesion enhancement metric (EL) is defined by Equation 7 below:

$$EL[\%] = \left|\frac{S_a - S_b}{S_b}\right| \cdot 100; \qquad \text{Equation (7)}$$

$S_b$ and $S_a$ are the signal intensity of an lesion region of interest (ROI) before and after the administration of contrast agent, respectively. In order to describe the efficiency of contrast agent, the enhancement efficiency $EL_{eff}$ is introduced and it is defined as EL per square root of total scan time (TA) as given by Equation 8 below:

$$EL_{eff} = EL / \sqrt{TA}, \qquad \text{Equation (8)}$$

Any of the image quality metrics defined above can be used as objective functions for the optimization for both pre-contrast imaging and post-contrast imaging. It should be understood that this disclosure is not limited to using the image quality metrics described herein. This disclosure contemplates that the method of data analysis will determine whether or not the objective functions for both pre-contrast and post-contrast imaging should be applied.

2. MRI System Overview

FIG. 1 depicts an MRI system 10, according to one or more embodiments described and shown herewith. In embodiments, the MRI system 10 shown in FIG. 1 includes a patient table 11, a static magnetic field generating unit 12, a gradient magnetic field generating unit 14 for generating respective magnetic fields in proximity to a target area 18 of an object 9, a transmitting and receiving unit 16, and a computing device 100. The patient table 11, the static magnetic field generating unit 12, the gradient magnetic field generating unit 14, and the transmitting and receiving unit 16 are placed within MRI RF shielding area 2 where noise of radio frequency is prevented from entering.

The static magnetic field generating unit 12 includes a main magnet configured to generate a strong static magnetic field in proximity to the target area 18 of the object 9. The static magnetic field generating unit 12 may be arranged to surround the target area 18 of the object 9. For example, the static magnetic field generating unit 12 may be a cylindrical-shaped unit. The gradient magnetic field generating unit 14 includes gradient magnetic field coils for generating gradient magnetic fields in an x-axis direction, a y-axis direction, and a z-axis direction, which are orthogonal to each other. The gradient magnetic field generating unit 14 may be arranged to surround the target area 18 of the object 9. For example, the gradient magnetic field generating unit 14 may be a cylindrical-shaped unit.

In embodiments, the transmitting and receiving unit 16 may include a transmission coil and a receiving coil. The transmission coil irradiates RF pulses to the object 9 and the receiving coil receives MR signals generated by the object 9. In some embodiments, the transmitting and receiving unit 16 may include a transceiver coil having the functions of both the transmission coil and the receiving coil. The receiving coil may be composed of, for example, a so-called array coil in which, for example, a plurality of coil elements are disposed to detect the MR signals generated by the object 9. An RF transmitter 34 may control the transmission coil of the transmitting and receiving unit 16 to irradiate RF pulses. A receiver 40 may receive MR signals generated by the object 9 from the receiving coil of the transmission and receiving unit 16. The RF transmitter 34 and the receiver 40 may communicate with the transmitting and receiving unit 16 through a transmitter/receiver interface 36.

In embodiments, the MRI system 10 includes the computing device 100. The computing device 100 includes a MRI system controller 22. The MRI system controller 22 may control the operations of the gradient coil drivers 32 that activate the gradient coils of the gradient magnetic field generating unit 14. The MRI system controller 22 may also control the operations of the RF transmitter 34 that activates the RF coil of the static magnetic field generating unit 12. The computing device 100 may receive MR signals from the receiving coil of the transmission and receiving unit 16 and reconstruct an MRI image based on the received MR signals. The details of the computing device 100 will be further described with reference to FIG. 1A below.

In embodiment, the computing device 100 may be operably coupled to other components of the MRI system 10, for example, using by any medium that facilitates data exchange between the components of the MRI system 10 and the computing device 100 including, but not limited to, wired, wireless and optical links. For example, the computing device 100 may convert the MR signals received from the transmitting and receiving unit 16 into k-space data. The computing device 100 may generate MR image data from the k-space data with image reconstruction processing. In some embodiments, the techniques for improving image quality with optimal variable flip angles may optionally be implemented using the MRI system 10.

3. Example Computing Device

Figure 1A:
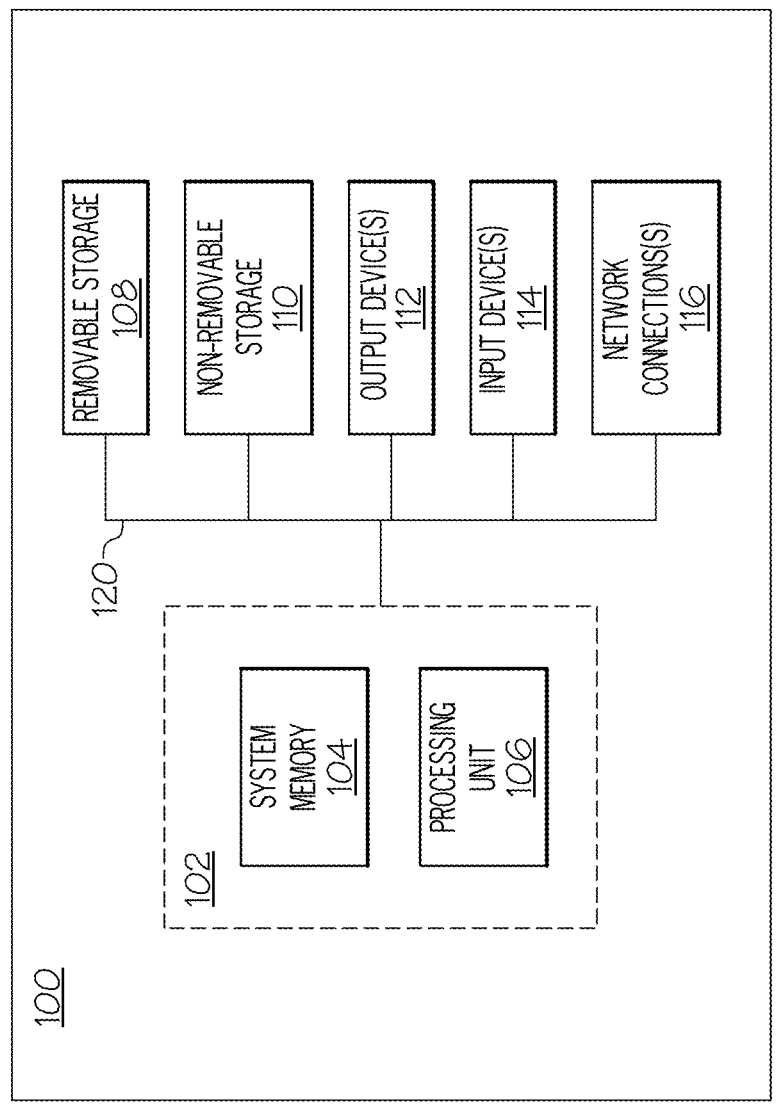
FIG. 1A is an example computing device.

FIG. 1A depicts a computing device 100 according to one or more embodiments shown and described herein. It should be appreciated that the logical operations described herein with respect to the various figures may be implemented (1) as a sequence of computer implemented acts or program modules (i.e., software) running on a computing device (e.g., the computing device described in FIG. 1A), (2) as interconnected machine logic circuits or circuit modules (i.e., hardware) within the computing device and/or (3) a combination of software and hardware of the computing device. Thus, the logical operations discussed herein are not limited to any specific combination of hardware and software. The implementation is a matter of choice dependent on the performance and other requirements of the computing device. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in a different order than those described herein.

It should be understood that the computing device 100 is only one example of a suitable computing environment upon which embodiments of the invention may be implemented. Optionally, the computing device 100 may be a well-known computing system including, but not limited to, personal computers, servers, handheld or laptop devices, multiprocessor systems, microprocessor-based systems, network personal computers (PCs), minicomputers, mainframe computers, embedded systems, and/or distributed computing environments including a plurality of any of the above systems or devices. Distributed computing environments enable remote computing devices, which are connected to a communication network or other data transmission medium, to perform various tasks. In the distributed computing environment, the program modules, applications, and other data may be stored on local and/or remote computer storage media.

In embodiments, the computing device 100 includes a controller 102 that includes one or more processing units 106 and one or more system memory modules 104. The controller 102 may be the same controller as the MRI system controller 22 in FIG. 1. In other embodiments, the controller 102 may be a separate controller from the MRI system controller 22 in FIG. 1. Depending on the exact configuration and type of computing device, the one or more memory modules 104 may be volatile (such as random access memory (RAM)), non-volatile (such as read-only memory (ROM), flash memory, etc.), or some combination of the two. The one or more processing units 106 may be a standard programmable processor that performs arithmetic and logic operations necessary for operation of the computing device 100.

In embodiments, the computing device 100 includes communication path 120 that provides signal interconnectivity between various components of the computing device 100. Accordingly, the communication path 120 may communicatively couple any number of processing units 106 with one another, and allow the components coupled to the communication path 120 to operate in a distributed computing environment. Specifically, each of the components may operate as a node that may send and/or receive data. As used herein, the term "communicatively coupled" means that coupled components are capable of exchanging data signals with one another such as, for example, electrical signals via conductive medium, electromagnetic signals via air, optical signals via optical waveguides, and the like.

Accordingly, the communication path 120 may be formed from any medium that is capable of transmitting a signal such as, for example, conductive wires, conductive traces, optical waveguides, or the like. In some embodiments, the communication path 120 may facilitate the transmission of wireless signals, such as Wi-Fi, Bluetooth, Near Field Communication (NFC) and the like. Moreover, the communication path 120 may be formed from a combination of mediums capable of transmitting signals. In one embodiment, the communication path 120 comprises a combination of conductive traces, conductive wires, connectors, and buses that cooperate to permit the transmission of electrical data signals to components such as processors, memories, sensors, input devices, output devices, and communication devices. Accordingly, the communication path 120 may comprise a vehicle bus, such as for example a LIN bus, a CAN bus, a VAN bus, and the like. Additionally, it is noted that the term "signal" means a waveform (e.g., electrical, optical, magnetic, mechanical or electromagnetic), such as DC, AC, sinusoidal-wave, triangular-wave, square-wave, vibration, and the like, capable of traveling through a medium.

The one or more processing units 106 may be configured to execute program code encoded in tangible, computer-readable media. Tangible, computer-readable media refers to any media that is capable of providing data that causes the computing device 100 (i.e., a machine) to operate in a particular fashion. Various computer-readable media may be utilized to provide instructions to the one or more processing units 106 for execution. Example tangible, computer-readable media may include, but is not limited to, volatile media, non-volatile media, removable media and non-removable media implemented in any method or technology for storage of information such as computer readable instructions, data structures, program modules or other data. One or more system memory modules 104, a removable storage 108, and a non-removable storage 110 are all examples of tangible, computer storage media. Tangible, computer-readable recording media may include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In embodiments, the one or more processing units 106 may execute program code stored in the one or more system memory modules 104. For example, a bus may carry data to the one or more system memory modules 104, from which the one or more processing units 106 receive and execute instructions. The data received by the one or more system memory modules 104 may be optionally stored on the removable storage 108 or the non-removable storage 110 before or after execution by the processing unit 106.

In embodiments, the computing device 100 may include additional storage such as removable storage 108 and non-removable storage 110 including, but not limited to, magnetic or optical disks or tapes.

The computing device 100 may also have input device(s) 114 such as a keyboard, mouse, touch screen, etc. The input device may be manipulated by an operator to input signals to the MRI apparatus to set the imaging method group, the performing order, the imaging condition, and the like. The computing device 100 may also have output device(s) 112 such as a display, speakers, printer, etc. The output device 112 may output image data such as local image data, diagnosis image data using display, printer and other displayer. The additional devices may be connected to the bus in order to facilitate communication of data among the components of the computing device 100.

Computing device 100 may also contain network connection(s) 116 that allow the device to communicate with other devices. The network connection(s) 116 may be any device capable of transmitting and/or receiving data via a wireless network. Accordingly, the network connection(s) 116 may include a communication transceiver for sending and/or receiving data according to any wireless communication standard. For example, the network connection(s) 116 may include a chipset (e.g., antenna, processors, machine readable instructions, etc.) to communicate over wireless computer networks such as, for example, wireless fidelity (Wi-Fi), WiMax, Bluetooth, IrDA, Wireless USB, Z-Wave, ZigBee, or the like.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

In some embodiments, the computing device 100 may include a workflow setting unit, an imaging operation determining unit, and an image reconstruction unit. The workflow setting unit may be a program module stored in the system memory modules 104. The workflow setting unit sets a first workflow relating to the MRI examination by estimating an imaging time of each of the imaging methods in the performing order initially set by a scan plan. Further, the workflow setting unit sets a second workflow relating to the MRI examination by estimating a shortest performing order, by which an examination time necessary to sequentially perform a plurality of imaging methods constituting the imaging method group set by the input unit is minimized. The imaging operation determining unit determines whether an imaging operation during a main imaging is implemented according to the workflow. In embodiments, the workflow setting unit and/or the imaging operation unit may be implemented using hardware, software, and or a combination thereof.

The image reconstruction unit may include an MR signal storage unit, a signal processing unit, and an image data storage unit. The MR signal storage unit (e.g., memory) stores the MR signals, which are collected by the receiver unit of the transmitting and receiving unit 16. The signal processing unit has an image reconstruction processing unit and an image processing unit. The image reconstruction processing unit generates image data from the MR signal storage unit by image reconstruction processing, for example, performed by a Fourier transformation such as 2D FFT. When the MR signals to a three-dimensional region are collected, the image reconstruction processing unit of the signal processing unit generates volume data. Subsequently, the image processing unit generates three-dimensional image data such as volume rendering image data, surface rendering image data and the like or two-dimensional image data, multi planar reconstruction image data, and the like, because predetermined image processing is performed for the volume data generated by the image reconstruction processing unit. Then, the image data described above obtained by the signal processing unit are stored to the respective storage regions of the image data storage unit.

4. Theory

One of the major goals in MRI is to develop fast acquisition technology. To achieve this goal, spin echo and gradient echo methods are routinely and widely used in clinical MRI.

1) Spin Echo

Spin-echo-based sequences provide a variety of image contrasts that highlight pathology and reduced image artifacts from susceptibility difference and static field inhomogeneity. Both 2 dimensional and 3 dimensional fast spin echo sequences may be used for contrast agent MRI. Additionally, the high-resolution 3 dimensional FSE may be used for assessing the complex anatomy of the joints. Various analytic and numerical algorithms, including extended phase graph (EPG)-algorithm and pseudo-steady state solution algorithm, may be used to describe the signal intensity of spin echo-based acquisition. Generally, conventional 3D fast spin echo sequences take several tens of minutes for sizeable volume coverage and limit their clinical application. Most recent years, 3D fast spin echo (or SPACE in Siemens, VISTA in Philips, CUBE in GE) have been optimized in clinically acceptable acquisition times through shortening the echo spacing, suppressing blurring with variable flip angles refocusing radio-frequency pulses, and increasing the useable duration of the spin-echo train. 3D fast spin echo sequences are growing in clinical application, including non-contrast agent and contrast agent MRI. Since these techniques apply relatively high, constant flip angles for the refocusing RF pulses for the lower k-space acquisition, there are subtle contrast differences between 2D and 3D fast spin echo. In present disclosure, a technique is described to optimize 3D fast spin echo-based sequence for contrast agent MRI with the use of one or more method for optimizing image quality metric. The technique uses at least one of analytic solution, extended phase graph (EPG)-algorithm, pseudo-steady-state solution algorithm, or windowed ramp approach. For example, the signal of a spin-echo sequence $F_{SE}(x)$ may be obtained by solving the Bloch's equation as follows:

$$SI(x) \propto M_0 \frac{\sin\alpha_{SE}(x) \cdot [1 - \cos(\beta_{SE}(x))] \cdot \left[1 - \cos\beta_{SE}(x) \cdot E_1 - (1 - \cos\beta_{SE}(x)) \cdot E_1 \cdot e^{\frac{TE}{2T_1}}\right]}{1 - \cos\alpha_{SE}(x) \cdot \cos\beta_{SE}(x) \cdot E_1} \cdot e^{-\frac{TE}{T_2}} \quad \text{Equation (9)}$$

where $\alpha_{SE}(x)$ and $\beta_{SE}(x)$ are the corrected flip angles of the excitation and refocusing pulses at position x, where $E_1 = \exp(-TR/T_1)$, $T_1$ is the longitudinal relaxation time. When $T_1 \gg TE$ and $TR \gg T_1$, Equation (9) can be simplified to:

$$SI(x) \propto \sin\alpha_{SE}(x) \cdot \sin^2\frac{\beta_{SE}(x)}{2} \quad \text{Equation (10)}$$

Generally, at least one of image quality metric including, but not limited to, signal intensity, signal-to-noise ratio (SNR), signal intensity efficiency, SNR efficiency, image resolution, total scan time, contrast, contrast-to-noise ratio (CNR), contrast efficiency, CNR efficiency, specific absorption rate (SAR) or image artifacts may be used as an objective function of protocol or sequence for computer simulation which generates the relationship between the objective function and the imaging parameters. That is, at least one of Equations 1-10 may be used for computer simulation, for example. It is noted that there is no analytic solution for Bloch Equation for complex sequences. For example, 3D fast spin echo with variable flip angle sequences (such as SPACE in Siemens, CUBE in GE, and VISTA in Phillips), signal intensity are described using one of approximation solution, numerical solution, and EPG algorithm (or coherence pathway). Complex sequences may include at least one of variable repetition time TR, a flip angle, a bandwidth, echo time, an echo number, and phases of radiofrequency pulses.

In some embodiments, the images acquired with the optimized variable flip angles may be any MR images. For example, the acquisitions may be two spatial dimensional, three spatial dimensional or three spatial plus temporal and thus four-dimensional images. The images may be also at least one of magnitude images, phase images, real images, imaginary images, complex images, including combinations thereof. It should be understood, however, that the above images are provided only as examples and that this disclosure contemplates acquiring other types of MR images.

2) Gradient Echo-Based Sequence

For example, inversion recovery gradient-recalled echo sequence (IR-GRE) is equivalent to MPRAGE magnetization prepared rapid gradient-echo and the inversion recovery spoiled gradient-echo (IR-SPGR or Fast SPGR with inversion activated or BRAVO), 3D turbo field echo (TFE), or 3D fast field echo (3D Fast FE). The sequence may provide important information about both pathology and structure. Generally, constant flip angles are used for excitation RE pulse train in MP-RAGE. The MP-RAGE sequence is composed of 3D-inversion recovery α and N equally-spaced readout RF pulses of flip angle θ and echo spacing τ. Repetition time TR is defined as the time interval between two successive inversion recovery pulses as shown by Equation 11 below:

$$TR = TI + N \cdot \tau + TD, TR = TI + \left[\left[\frac{N}{2}\right] \cdot \tau\right] + TD. \quad \text{Equation (11)}$$

where τ is echo spacing time, N is the total number of readout RF pulses, TI is the time interval between the inversion recovery pulse and the first RF readout pulse, and TD is delay time.

For successive excitations in the MP-RAGE sequence, signal intensity from the $i^{th}$ read-out pulse is given by Equation 12 below:

$$SI \propto M_i^- \cdot \sin(\theta) = M_0 \cdot \sin(\theta) \cdot \quad \text{Equation (12)}$$

$$\left\{ \frac{(1-\delta)\left[1-\mu^{i-1}\right]}{1-\mu} + (\mu)^{i-1} \cdot (1-\gamma) - \gamma \cdot \mu^{i-1} \cdot \frac{M_{eq}}{M_0} \right\},$$

In order to simplify the formula for signal intensity, followings definitions are used:

$$\gamma = \exp(-TI/T_1), \delta = \exp(-\tau/T_1), \rho = \exp(-TR/T_1),$$

$$\varphi = \exp(-TD/T_1), \mu = \delta \cdot \cos(\theta).$$

The steady state magnetization $M_{eq}$ after several TRs is given by Equation 13 below:

$$M_{eq} = \frac{1 - \varphi + \frac{\varphi \cdot \cos(\theta) \cdot (1-\delta)\left[1-\mu^{N-1}\right]}{1-\mu} + \varphi \cdot \cos(\theta) \cdot \mu^{N-1} + \rho \cdot \cos(\alpha) \cdot \cos^N(\theta)}{1 - \rho \cdot \cos(\alpha) \cdot \cos^N(\theta)} \cdot M_0, \quad \text{Equation (13)}$$

The white matter (WM) and gray matter (GM) contrast from the $i^{th}$ read-out RF pulse is given by Equation 14 below:

$$\text{Con}_{i,WM-GM} \propto s_{i,WM} - s_{i,GM}, \quad \text{Equation (14)}$$

where $s_{i,WM}$ and $s_{i,GM}$ are the signal intensities of WM and GM, which can be calculated using Equation 11 with the longitudinal relaxation times and protein densities of WM and GM, respectively. In Equation 13, the GM-WM contrast is a function of N, TI, τ, θ and the temporal position of the read-out RF pulse. Generally, the smaller the acquisition bandwidth is, the higher SNR and CNR are.

Although the property in the image domain is determined by all Fourier components in the entire k-space, contrast between WM and GM is mostly determined by the center of k-space which is associated with the low spatial frequency components in k-space. According to Equations 11-13, GM and WM contrast from the ith read-out RF pulse is a function of the temporal position of the RF pulse and the total number of read-out RF pulses N. In embodiments, the variable flip angle distribution is optimized for a given k-space strategy such that each k-space line is expected to be maximized for whole k-space. The k-space strategy may be at least one of a k-space sampling order, a rectilinear imaging, radial imaging, echo planar imaging, spiral imaging, projection reconstruction imaging, a random k-space trajectory, a under-sampled k-space trajectory, or a partial k-space sampling trajectory. The k-space sampling order may be at least one of a sequential sampling order, a centric sampling order, an interleave sampling order, a reverse sampling order, or a random sampling order It is noted that any sequence may be optimized to improve image quality and then increase MRI value. That is, the imaging sequences may include at least one of gradient echo, spin echo, fast gradient echo, fast spin echo, but not limited to, and their variations with or without magnetization preparation and/or specific tissue suppression, parallel imaging technique, under-sampling technique, and/or the administration of contrast agent.

5. Exemplary Results

Traditional MRI value have focused on diagnostic accuracy, including sensitivity, specificity, and predictive value and clinical process outcomes. MRI costs may be mainly fixed on initial capital, depreciation, and upgrades, service contracts, staff costs or their variables (e.g., contrast and consumables). Most research focus on the development of the innovative MRI techniques for the improvement of imaging capabilities. That is, it focuses on the numerator of Equation (1), by increasing the amount and quality of diagnostic information provided by MRI. Currently, new MRI delivery systems increasingly promotes to achieve higher quality and lower cost simultaneously. From a technical standpoint, various factors, such as spatial resolution, signal intensity tissue contrast, and artifact reduction all affect the diagnostic performance of MRI. Inaccurate diagnoses may lead to unnecessary medical interventions, delay in correct treatment, and increased patient morbidity. It may also result in increased direct and indirect costs to the patient, as well as to the payer. Thus, the techniques that could reduce the exam time and increase the efficiency in the course of clinical intervention are most valuable. However, from a patient's perspective, these technical factors do not reflect metrics of broader clinical relevance such as opportunity cost and discomfort for longer scan times, improvement in functional status (both physical and mental), quality of life, morbidity and disability, downstream care and, and death.

Ideally the MRI exam protocol should be performed quickly with free of artifacts, done little or no risk of adverse effects at the lowest cost possible. Every additional sequence which adds to the time of the MRI examination and thus the cost of the examination must contribute to the incremental diagnostic value. But in current clinical practices, some of additional sequences may not only increase MRI cost, but also lead to increased false positive findings. That is, the additional sequences may reduce the MRI value. Therefore, it is very important to integrate costs and outcomes of the MRI techniques for improving the quality and safety of healthcare to increase the MRI value.

Figure 2:
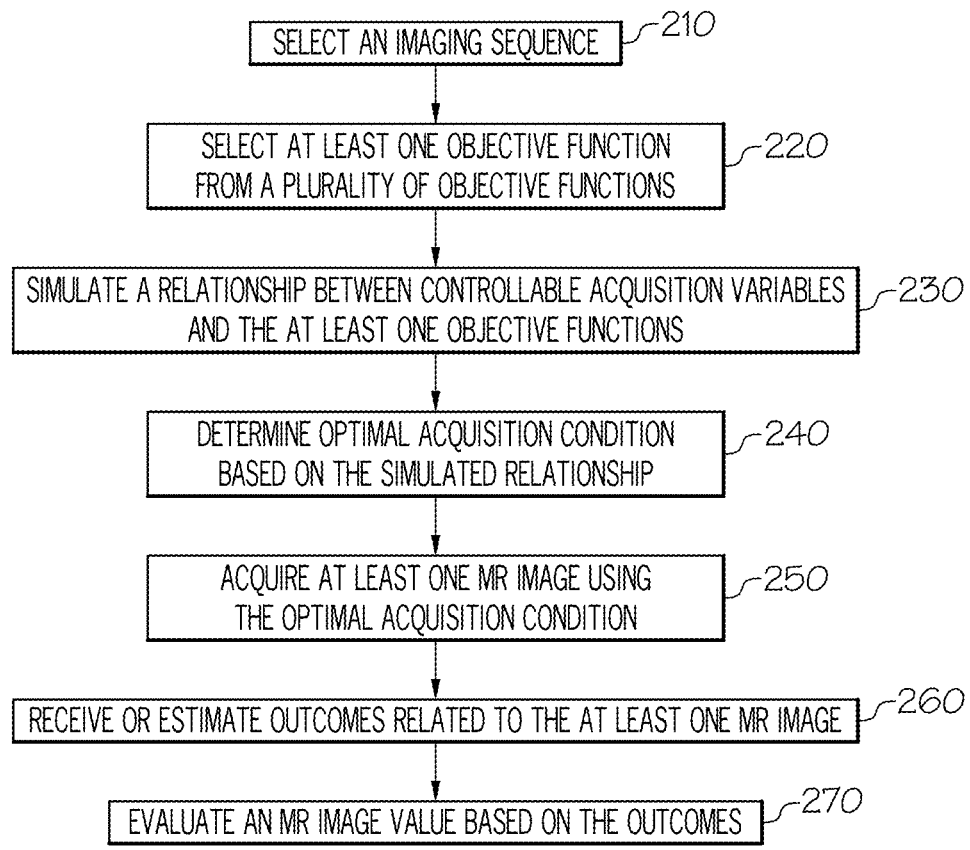
FIG. 2 is a flowchart illustrating example operations for improving high value MRI.

FIG. 2 shows a flowchart illustrating example operations for obtaining high value MRI. In block 210, the MRI system 10 selects an imaging sequence. The imaging sequences may include 2 dimensional or 3 dimensional, one slab or multiple slabs IR-GRE sequence, fast spin echo sequence, steady-state free precession sequence, but not limited thereto, and balanced steady-state free precession sequence with and/or without magnetization preparation and/or specific tissue suppression.

Figure 4:
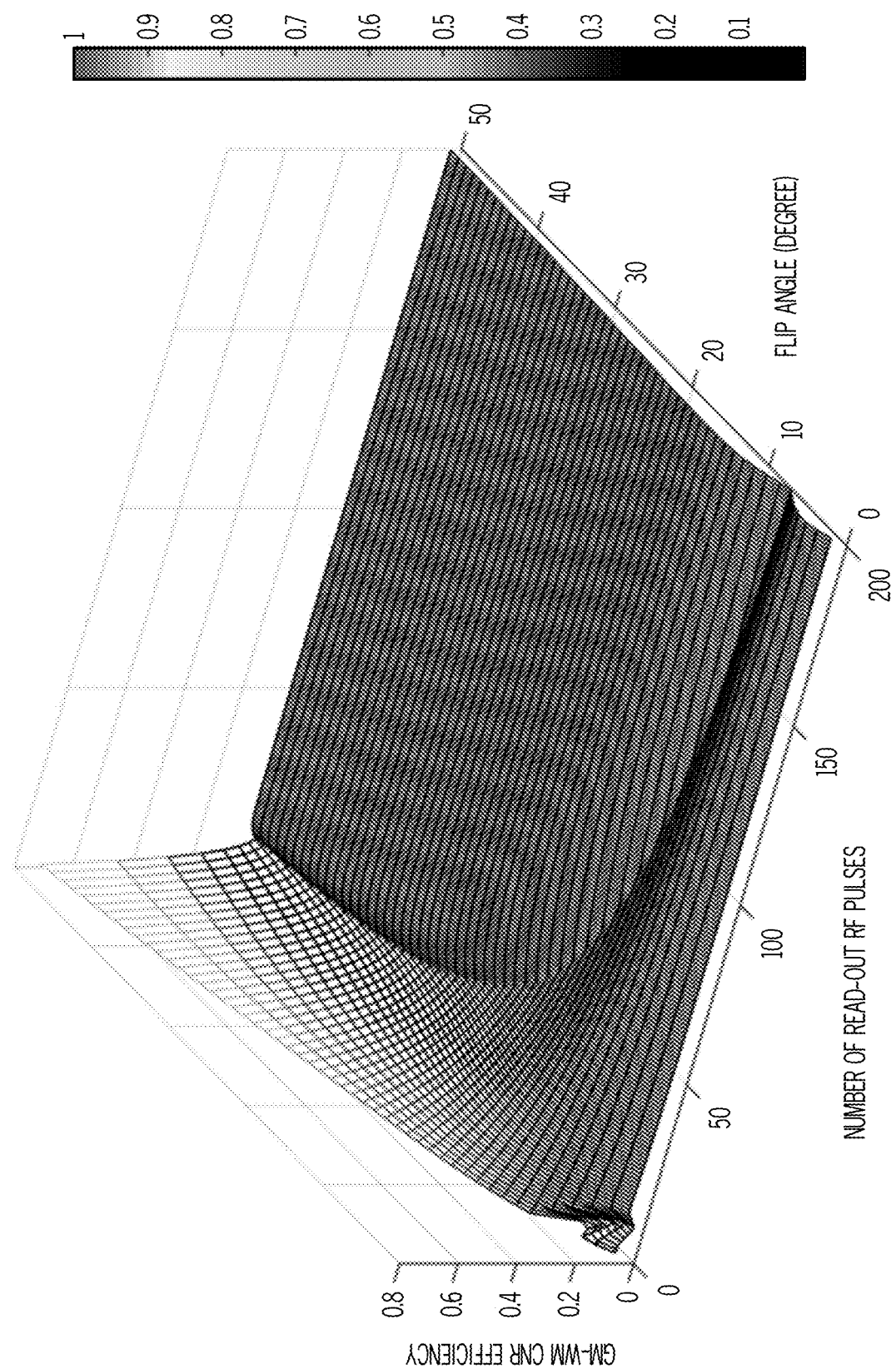
FIG. 4 is a graph illustrating simulated gray matter-white matter contrast to noise (CNR) efficiency as a function of different constant flip angles and number of excitation radiofrequency pulses in magnetization preparation rapid gradient echo sequence (IR-GRE).

In block 220, the MRI system 10 selects at least one objective function from a plurality of objective functions. The objective function may include at least one of a contrast efficiency metric, a signal efficiency metric, a lesion enhancement efficiency metric or an artifact metric. A contrast efficiency metric may include at least one of contrast efficiency and contrast-to-noise ratio (CNR) efficiency. A signal efficiency metric may include at least one of signal efficiency and signal-to-noise ratio (SNR) efficiency. A lesion enhancement efficiency metric may include at least one of lesion enhancement efficiency and lesion enhancement-to-noise ratio efficiency. An artifact metric may include, but is not limited to, noise, signal inhomogeneity, SNR inhomogeneity, contrast inhomogeneity, CNR inhomogeneity, signal loss, geometry distortion or image ghost, or motion artifact In block 230, the MRI system 10 simulates a relationship between controllable acquisition variables and the objective functions. For example, the MRI system may simulate a relationship between a variable flip angle and the CNR efficiency based on Equations 11 through 14. FIG. 4 depicts an exemplary simulation between the GM-WM CNR efficiency and each flip angle, which will be described in detail below. As another example, the MRI system may simulate a relationship between each flip angle and image artifacts. The MRI system may simulate a relationship between each flip angle and any other objective functions including signal intensity, signal-to-noise ratio (SNR), signal intensity efficiency, SNR efficiency, image resolution, total scan time, contrast, contrast-to-noise ratio (CNR), contrast efficiency, or specific absorption rate (SAR). The simulation may be performed by using at least one of analytic solution, approximation solution, numerical solution, and EPG algorithm of Bloch equations for the imaging sequence and MR parameters of a tissue. The MR parameters may include at least one of $T_1$ relaxation, $T_2$ relaxation, $T_2$ star relaxation, but not limited to, proton density, diffusion, magnetic susceptibility, oxygen/deoxygenated-hemoglobin, or magnetization transfer. One or more MR parameters may change based on at the least one of an age, a pathophysiological change, a physiological change, an electrophysiological change, a disease in tissue, an implanted or injected material, or in-take of medicine.

The controllable acquisition variables include all variables which may be changeable or controlled by both hardware and software. The controllable acquisition variables comprise at least one of imaging parameters, hardware selection or setting, and software selection or setting, for example, flip angle, accelerator factor, slice number, but not limited to, partial Fourier factor, inversion recovery time, echo space time, repetition time, RF phase, saturation pulse, echo time, field of view, matrix.

In embodiments, the simulation may be performed using Bloch Equations (also referred to herein as Bloch's Equations). Additionally, a solution of the Bloch Equations may be at least one of an analytic solution, a numerical solution, or an approximation solution, and the extended phase graph (EPG) algorithm of Bloch equations for controllable acquisition variables and MR parameters of a tissue.

In block 240, the MRI system 10 determines optimal acquisition condition based on the simulated relationship. In embodiments, the optimal acquisition condition maximizes image quality of the MR image. For example, the MRI determines optimal variable flip angle distribution that maximizes GM-WM CNR efficiency, which will be described in detail with references to FIGS. 4 and 5 below. As another example, the MRI system determines optimal variable flip angle distribution that minimizes image artifacts. In some embodiments, the MRI system balances the optimal variable flip angle distribution in order to maximize the CNR efficiency as well as minimize the image artifacts. In some embodiments, the MRI system 10 trade-offs the influence of the controllable acquisition variables for MRI value in whole k-space acquisition to determine optimal acquisition condition. Fox example, image contrast and spatial resolution may be balanced to reach better outcomes for clinical and research practices (such as diagnoses and treatments).

In step 250, the MRI system 10 acquires at least one MR image of a region of interest using the optimal acquisition condition. The acquired image may be at least one of a magnitude image, a phase image, a real image, an imaginary image, or a complex image. The acquired image may be at least one of an image of a fetus, preterm newborn, full-term newborn, neonate, infant, child, adult, or aging subject with and without disease in a region of interest. According to the detailed practices, the optimal acquisition conditions may be used to at least one aims of improving image quality, increasing MRI efficiency, reducing scan time, suppressing the non-targeted signal intensity, but not to limited, increasing accuracy of diagnoses, reducing image artifacts for increase MRI value. In embodiments, the MRI system 10 may select pre-determined acquisition setting. The pre-determined acquisition setting may include both hardware and software setting. It is comprised by at least one of spatial resolution, 2 dimensional acquisition, 3 dimensional acquisition, but not limited to, saturation, partial Fourier acquisition, magnetization preparation, fat saturation, receiver bandwidth, parallel imaging techniques, transmit bandwidth, navigation, trigger options, multi-nuclear options, or saturation band. The region of interest may include at least a portion of a subject's body with or without disease. The portion of the subject's body may be at least one of an extremity, brain, spine, neck, chest, breast, joint, prostate, pelvis, or abdomen. The region of interest may include a portion of an extremity, brain, spine, neck, chest, breast, joint, prostate, pelvis, or abdomen. The region of interest may include normal or healthy tissue and lesion tissues.

In embodiments, the MRI system 10 may select an optimal k-space strategy. The k-space strategy may include a k-space trajectory and a sampling order. The k-space trajectory may include at least one of a rectilinear, radial, echo planar imaging, spiral, projection reconstruction, random, under-sampled, or partial k-space sampling trajectory. The sampling order may include at least one of a sequential, centric, interleaved, reverse, or random sampling order.

In step 260, the MRI system 10 receives or estimates outcomes related to the at least one MR image. The outcomes may be directly received from clinical practices or be estimated by machine learning.

In step 270, the MRI system 10 evaluates an MR image value based on the outcomes. The MRI value is estimated by the ratio of outcomes to costs of delivering the outcomes.

Figure 3:
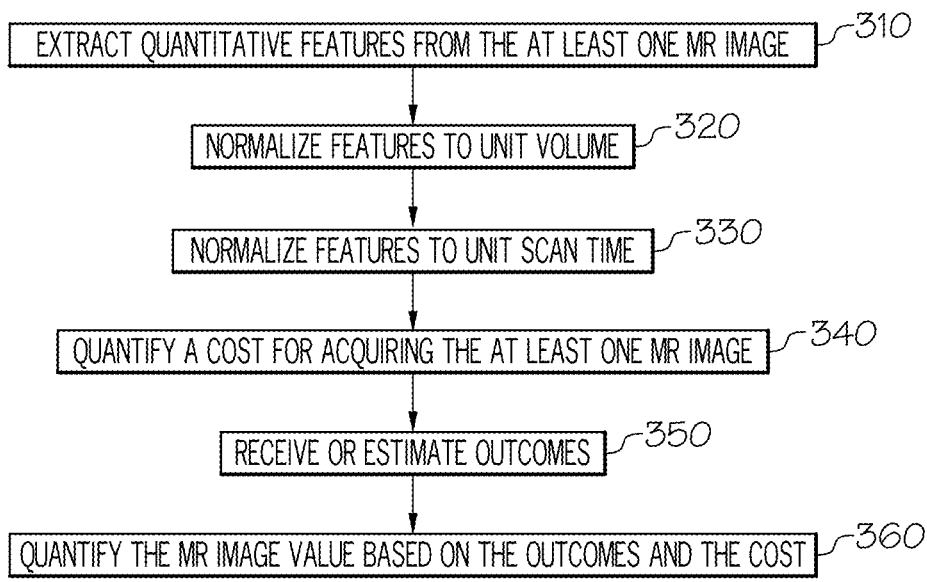
FIG. 3 is a flowchart illustrating example operations for evaluating MRI value.

FIG. 3 shows a flowchart illustrating example operations for evaluating MRI image value. In block 310, the MRI system 10 extracts quantitative features from the at least one MR image. Quantitative features may include.

In block 320, the MRI system 10 normalizes the quantitative features to unit volume. For example, In block 330, the MRI system 10 normalizes features to unit scan time. For example, In block 340, the MRI system 10 quantifies costs. The costs are associated with resources consumed by a specific object or medical intervention. For example, the healthcare costs include the cost for physician services, technician services, imaging exams, diagnostic tests, and hospitalization expense. The MRI system 10 may quantify one or more of the cost for physician services, technician services, imaging exams, diagnostic tests, and hospitalization expense.

In block 350, the MRI system 10 receives or estimates the outcomes related to the normalized quantitative features from the at least one MR image with or without clinical parameters (such as blood pressure, age, body mass index, etc.). The outcomes may be directly received from clinical practices or be estimated by machine learning.

In block 360, the MRI system 10 quantifies an MR image value based on the outcomes and the quantified cost. The MRI value is estimated by the ratio of the outcomes to the quantified cost.

As described herein, MRI parameters may change based on the at least one of an age, a pathophysiological change, a physiological change, an electrophysiological change, a disease in tissue, an implanted or injected material, or in-take of medicine. The MR parameters may include, but are not limited to, at least one of $T_1$ relaxation, $T_2$ relaxation, $T_2$ star relaxation, proton density, diffusion, magnetic susceptibility, oxygen/deoxygenated-hemoglobin, or magnetization transfer. The MR parameters may be estimated using MRI/MRS measurements or obtained from the public publications including papers, but not limit to, patents, research reports, books. For example, $T_1$, $T_2$, and proton density of the gray matter (GM), white matter (WM) and cerebrospinal fluid (CSF) of adult healthy human brain, which at 3.0 Tesla are 1300/900/3500 milliseconds, 100/90/300 milliseconds, and 0.75/0.65/1.0, respectively.

FIG. 4 is a graph illustrating simulated gray matter (GM)-white matter (WM) contrast to noise (CNR) efficiency as a function of different constant flip angles and the number of read-out excitation radiofrequency pulses in magnetization preparation rapid gradient echo sequence (IR-GRE) at the inversion recovery time TI of 500 milliseconds. The contrast-to-noise ratio (CNR) efficiency is relatively high at the transient state of excitation RF echo train. The CNR efficiency is rapidly reduced as the number of echo acquisition number increases to the $60^{th}$ echo acquisition. Additionally, the CNR efficiency is not continuous and/or monotonous function of flip angles. The optimal flip angle for each acquisition is variable for maximum CNR efficiency. When the number of echo acquisition is around the $60^{th}$ echo acquisition, the CNR efficiency becomes minimal. Then, the CNR efficiency increases rapidly with the increasing echo acquisition after around the $60^{th}$ echo acquisition and then slowly reduces with the increasing echo acquisition.

Figure 5:
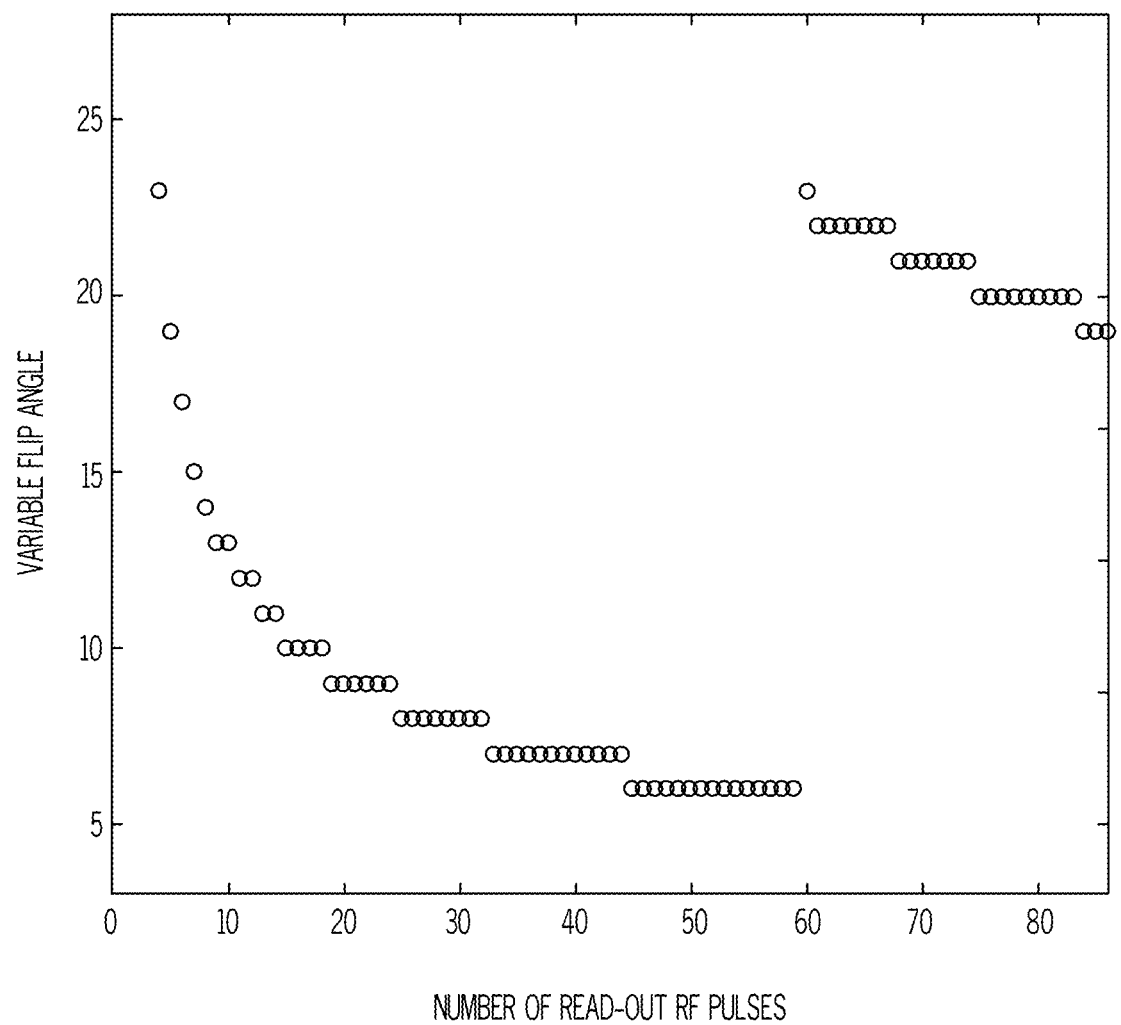
FIG. 5 shows optimal variable flip angles as a function of number of read-out excitation radiofrequency pulses to maximize the GM-WM CNR efficiency for each excitation radiofrequency pulse.

FIG. 5 shows optimal variable flip angles as a function of number of read-out excitation radiofrequency pulses to maximize the GM-WM CNR efficiency for each excitation radiofrequency pulse. The optimal variable flip angles are calculated from FIG. 4. For example, the optimal variable flip angles are calculated from the simulation of GM-WM CNR efficiency as a function of different constant flip angles and the number of read-out excitation radiofrequency pulses. The optimal flip angle may be variable for whole k-space.

In some embodiments, by trade-offing the CNR efficiency (low spatial frequency k-space components) and spatial resolution (high spatial frequency k-space components), an optimal constant flip angle of 16° for IR-SPGR sequence may be selected. If the constant flip angle is much greater than 16°, such as 25°, the image acquired at the flip angle of 25° will have very strong signal intensity because the CNR efficiency at the low spatial frequency k-space components is relative high. Specifically, the CNR efficiency at the low spatial frequency k-space obtained with the flip angle of 25° is greater than the CNR efficiency at the low spatial frequency k-space obtained with the flip angle of 16°. However, for the MR image acquired with the flip angle of 25°, blurring at the GM-WM edge will be observed because the CNR efficiency at the high spatial frequency k-space components is relatively low compared to the CNR efficiency at the high spatial frequency k-space components obtained with the flip angle of 16°. As a result, with the trade-off, the resolution of acquired image may be enhanced by using the constant flip angle of 16 degree which is higher than the recommended flip angle of 12 degree.

Figure 6A:
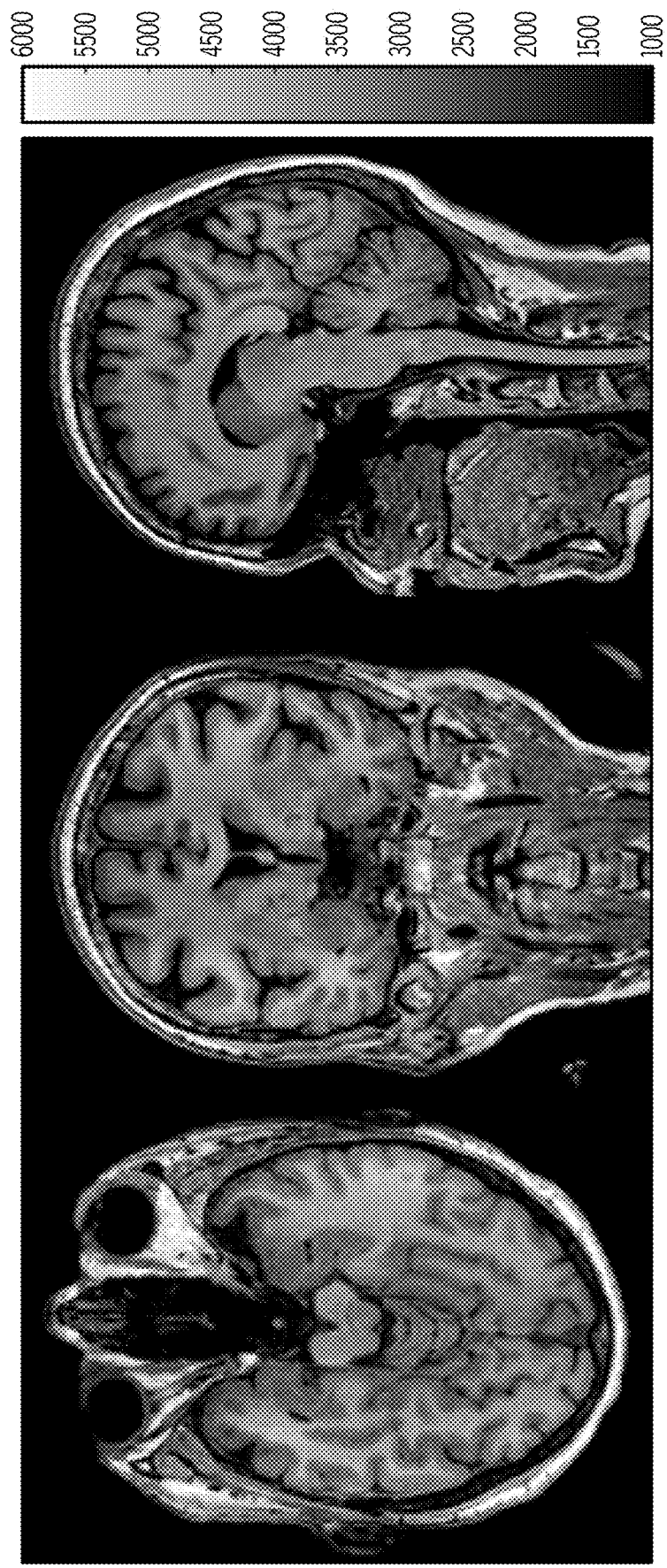
FIG. 6A depicts in vivo healthy brain images acquired according to conventional clinical protocol.
Figure 6B:
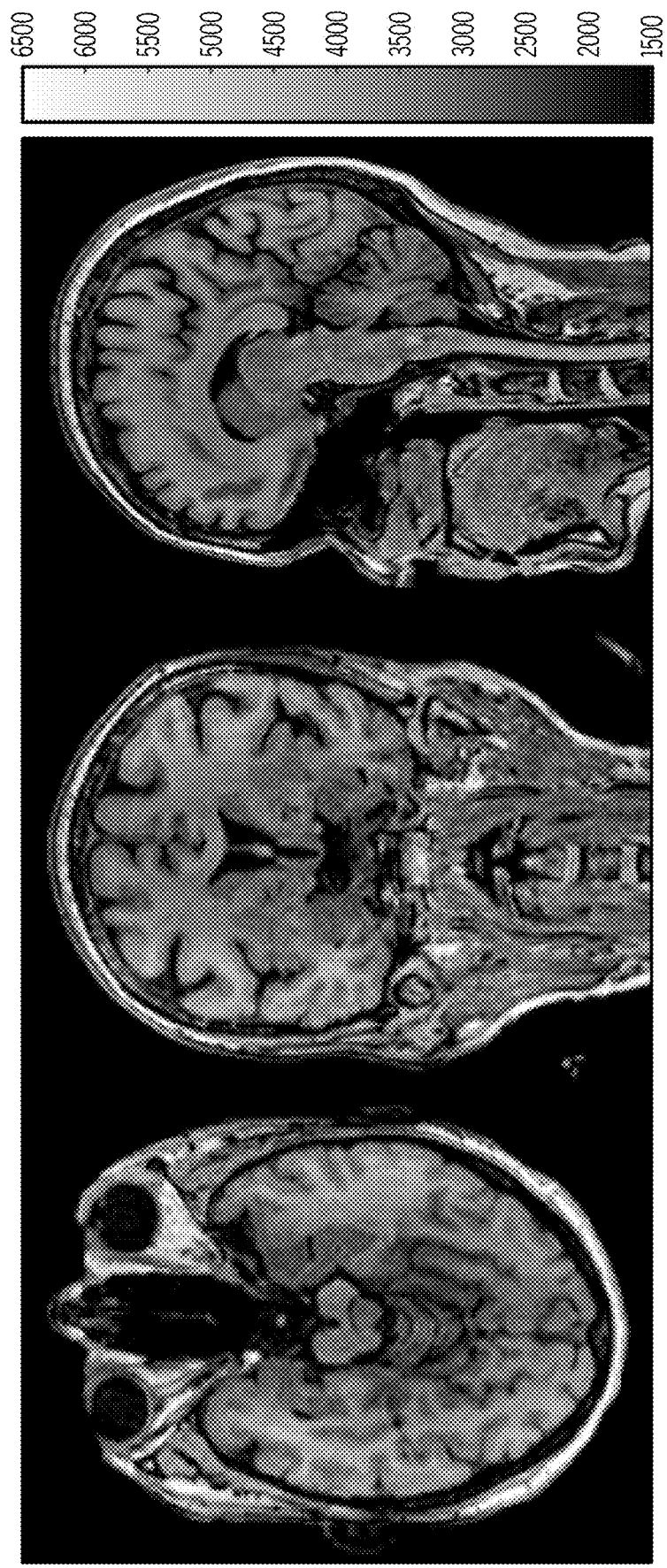
FIG. 6B depicts in vivo healthy brain images acquired according to the protocol of the present disclosure.

FIGS. 6A and 6B depict brain images of volunteer scanned on a 3T GE HDxt scanner with an 8-channel head coil. FIG. 6A depicts in vivo healthy brain images according to conventional clinical protocol, particularly, using 3D IR-SPGR sequence with conventional imaging parameters: 1 mm resolution, TI 450, flip angle 12°, and total scan time 4 minutes and 29 seconds. FIG. 6B depicts in vivo healthy brain images acquired according to the protocol of the present disclosure, particularly, using optimal imaging parameters including: 1 mm resolution, TI 500 milliseconds, flip angle 16°, and total scan time 2 minutes and 53 seconds. Images acquired according to the conventional clinical protocol as shown in FIG. 6A and images acquired according to the protocol of the present disclosure as shown in FIG. 6B exhibit similar image quality in GM-WM contrast and their signal intensity. However, the total scan time when the protocol according to the present disclosure is employed is more than 30% less than the total scan time when the conventional clinical protocol is employed because partial Fourier acquisition shortens scan time and the image quality reduction caused by partial Fourier acquisition are offset by the optimization discussed above. Thus, the present protocol provides higher MRI efficiency than the conventional clinical protocol due to the reduced scan time without the penalty of image quality reduction. Quantitative analysis indicates that the images acquired with our optimal condition increase MRI CNR and SNR efficiencies more than 50%, compared with those with recommended protocol by FDA and NCI. The improved image quality (1) reduces total imaging time and avoids complex image co-registration techniques; (2) offers specific advantages for engaging with this opportunity; (3) provides the potential benefits of increasing spatial-resolution for early detection of blood-brain barrier breakdown; (4) offers a potential ability to sub-groups of brain metastases to contribute significantly to precision medicine. (5) offers the ability of enhanced MRI to quantitatively assess tumor cell permeability for guiding precision medicine.

Generally, early detection of the disease strongly influences the outcomes. The early detection may improve the quality of life and make progress toward developing new treatments that could halt or reverse the progression of the disease. Early diagnosis and effective treatment may lead to improved quality and length of survival. Early detection usually offers the best chance to beat cancer. It is possible to measure an individual's disease risk, the development and progression of disease, and the response to therapy. Ultimately, Early Detection Research Network (EDRN) research will aid in prevention and in early therapeutic intervention, based on early detection of disease. For example, annual screening mammography can find breast cancer at early stage and improve life quality and expectancy in women. The early detection of breast cancer with treatments can reduce the risk of death toward zero. This is associated with a value of $50,000 to $200,000 per patient for each year of additional life expectancy and is estimated to cost $19,000 per year in health care. Improved mammographic accuracy would allow the proven benefits of mammography to further outweigh the risks of false positives, which in turn could decrease the controversy surrounding the issue of appropriate screening guidelines.

Figure 7:
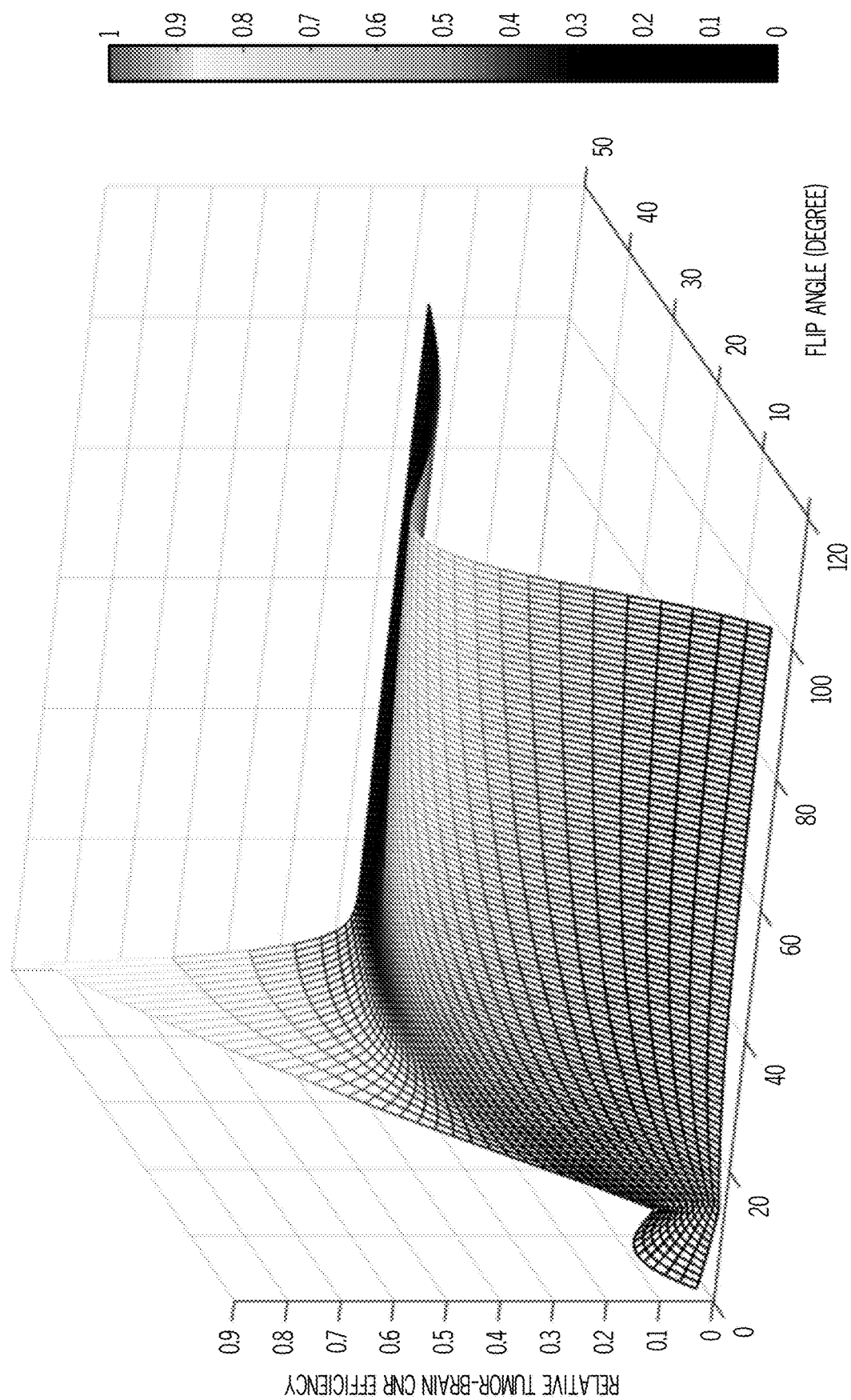
FIG. 7 is a graph illustrating simulated contrast enhanced lesion-brain tissue contrast to noise (CNR) efficiency as a function of different constant flip angles and number of excitation radiofrequency pulses in magnetization preparation rapid gradient echo sequence (IR-GRE).

In some embodiments, contrast-to-noise ratio efficiencies are simulated between contrast enhanced (CE) lesion and normal white matter (WM) (CE lesion-WM), using the solution of Bloch's equation, based on the values of $T_1$, $T_2$, and proton density of the WM, GM and Gadavist enhanced lesion brain at 3.0 Tesla: 1400/850/250 milliseconds, 100/90/180 milliseconds, and 0.75/0.65/0.8, respectively. FIG. 7 shows enhanced lesion-brain tissue contrast-to-noise ratio (CNR) efficiency as a function of the number of read-out excitation radiofrequency pulses or echo acquisitions. At the transient state of excitation RF echo train, tumor-tissue CNR efficiency varies rapidly and reduces as the number of read-out echo acquisitions increases until the transverse magnetization reaches a steady state. Further analysis indicated that the optimal variable flip angle distribution to maximize the enhanced tumor-brain tissue efficiency depends on the number of read-out excitation radiofrequency pulses, as shown in FIG. 5. According to the central view k-space sampling order, by trading off the CNR efficiency (low spatial frequency k-space components) and spatial resolution (high spatial frequency k-space components), an optimal constant flip angle of 18 degrees may be selected for IR-SPGR sequence after the administration of contrast agent. The optimal flip angles and k-space strategy were determined across whole k-space because low and high spatial frequency k-space components respectively determine tumor-tissue CNR efficiency and spatial resolution.

Figure 8:
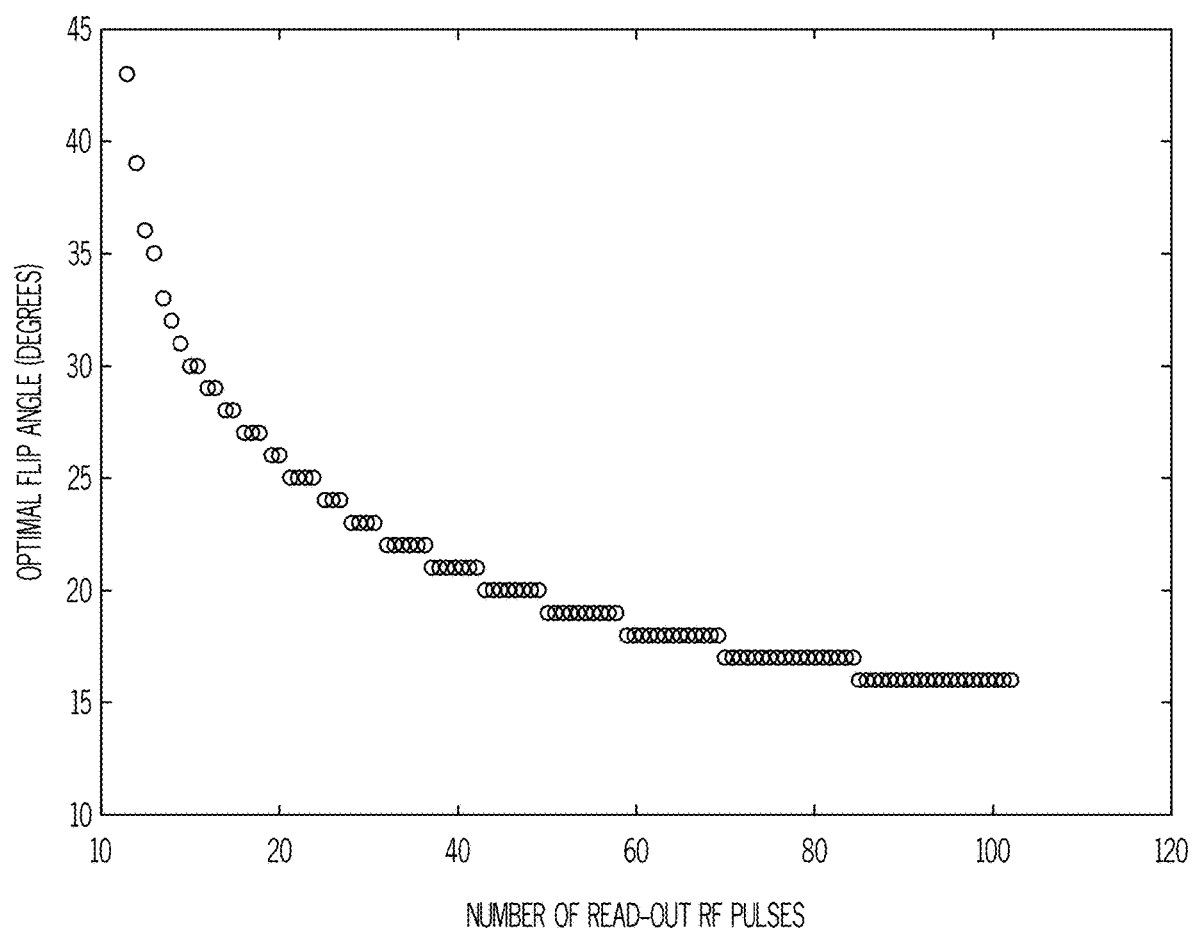
FIG. 8. Optimal variable flip angles distribution as a function of number of excitation radiofrequency pulses to maximize contrast enhanced lesion-brain tissue contrast to noise (CNR) efficiency for each excitation radiofrequency pulse.

FIG. 8 shows optimal variable flip angles as a function of number of read-out excitation radiofrequency pulses to maximize the tumor-normal brain tissue CNR efficiency for each excitation radiofrequency pulse. The optimal variable flip angles are calculated from FIG. 7. For example, the optimal variable flip angles are calculated from the simulation of the tumor-normal brain tissue CNR efficiency as a function of different constant flip angles and the number of read-out excitation radiofrequency pulses. The optimal flip angle may be variable for whole k-space.

Figure 9A:
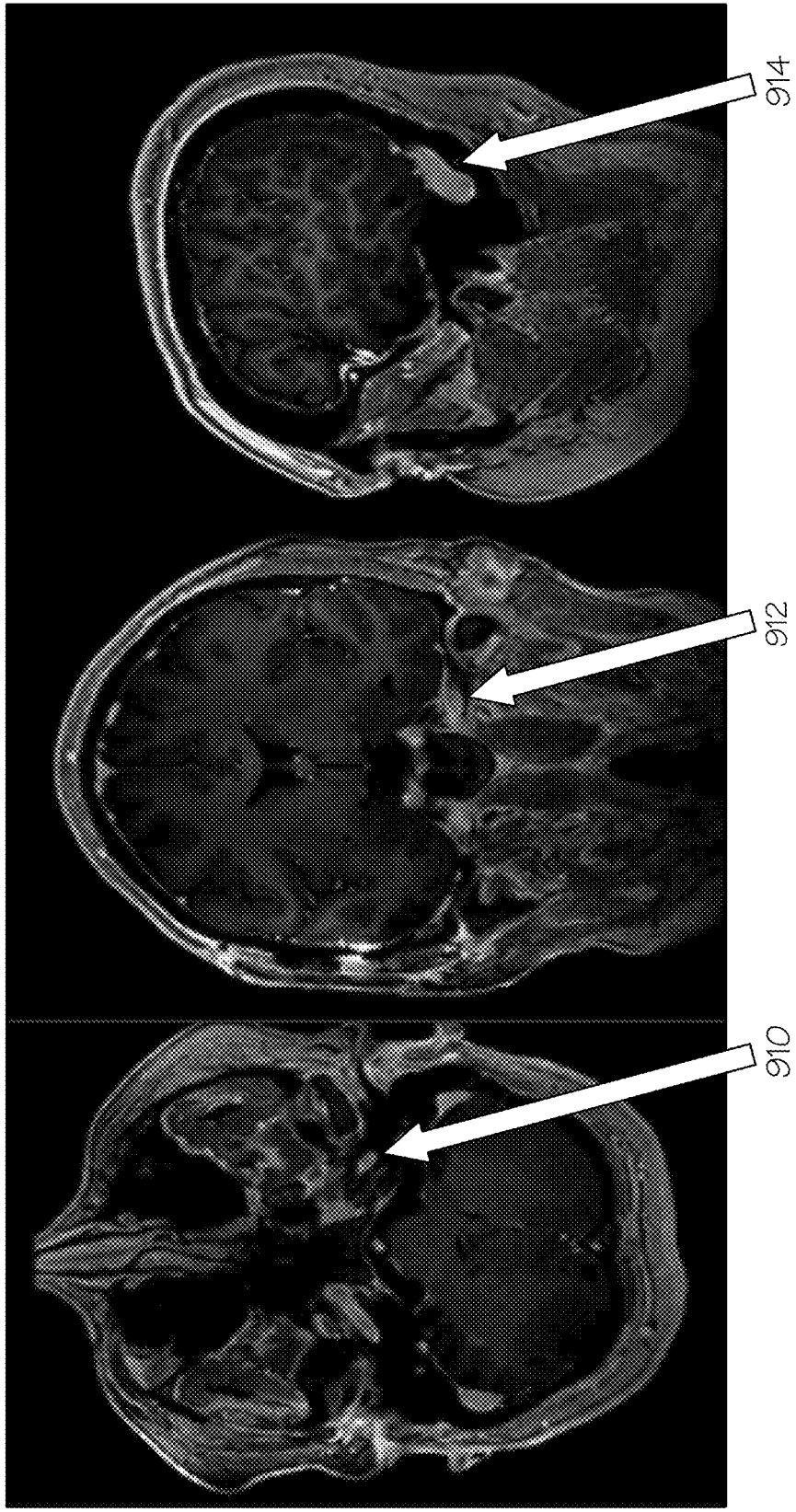
FIG. 9A depicts in vivo brain images of patient with brain tumor which are acquired with conventional protocol.
Figure 9B:
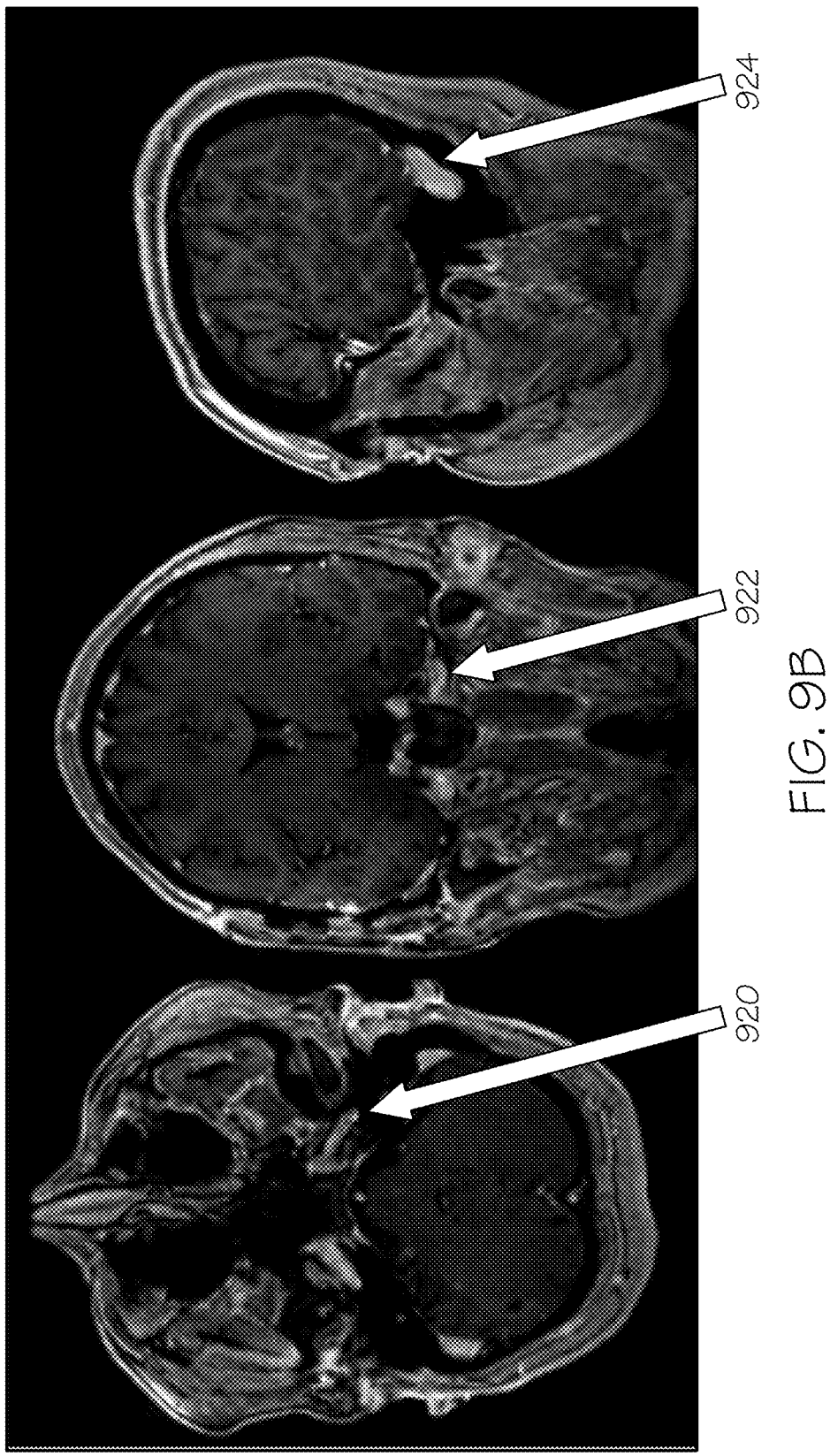
FIG. 9B depicts in vivo brain images of patient with brain tumor which are acquired with the protocol according to the present disclosure.

FIGS. 9A and 9B depict in vivo brain images acquired with IR-SPGR sequence after the administration of 0.1 mmol/kg Gadavist. In embodiments, a patient is scanned on a 3T General Electric HDxt scanner equipped with an 8-channel phased array head coil. Some subjects are scanned after contrast administration of 0.1 mmol/kg Gadavist. Brain images are obtained using both routine 3D IR-SPUR sequence and then with our optimized parameters. The conventional routine 3D IR-SPGR parameters include: 1 millimeter (mm) isotropic resolution, TI 450 milliseconds, a flip angle of 12 degrees, and a total scan time of 4 minutes and 29 seconds. The optimized parameters according to the present disclosure include: 1 mm isotropic resolution, TI 500 milliseconds, a flip angle of 18 degrees, and a total scan time of 2 minutes and 53 seconds. FIG. 9A depicts acquisition using the flip angle of 12° according to the conventional routine acquisition, and FIG. 9B depicts using flip angle 18° according to the present disclosure. Images acquired with conventional clinical protocol as shown in FIG. 9A and the image acquired with the protocol of the present disclosure as shown in FIG. 9B exhibit the similar enhanced lesion in size, boundary and structure. Specifically, in FIG. 9A, lesions 910, 912, and 914 are shown in different MRI views of the subject. In FIG. 9B, lesions 920, 922, and 924 are shown in different MRI views of the subject. However, the total scan time when the present protocol is employed is more than 30% less than the total scan time when conventional clinical protocol. Thus, the present protocol provides higher MRI efficiency or MRI value than the conventional clinical protocol in detecting enhanced lesion due to reduced scan time.

The methods described herein may further include using the acquired image for diagnosis, prognosis, surrogate endpoint, or therapeutic response. The methods described herein may further include using the acquired image for computer-aided diagnosis.

It should be understood that the above-described subject matter may be implemented as a computer-controlled apparatus, a computer process, a computing system, or an article of manufacture, such as a computer-readable storage medium. Other systems, methods, features and/or advantages will be or may become apparent to one with skill in the art upon examination of the following drawings and detailed description. It is intended that all such additional systems, methods, features and/or advantages be included within this description and be protected by the accompanying claims.

By employing such a series of refocusing RF pulses, the usable duration of the echo train may be extended substantially beyond that obtainable with conventional methods. This increase in the echo-train duration may be used to decrease the image acquisition time and/or increase the spatial resolution.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A magnetic resonance imaging (MRI) system comprising:
   a control unit comprising:
   a processing unit;
   a system memory; and
   machine readable instructions stored in the system memory that, when executed by the processing unit, cause the processing unit to:
   select an imaging sequence;
   select at least one objective function from a plurality of objective functions;
   simulate a relationship between controllable acquisition variables and the at least one objective function;
   determine optimal acquisition condition based on the simulated relationship,
   acquire at least one MR image of a region of interest using the optimal acquisition condition;
   receive or estimating outcomes related to the at least one MR image, the outcomes being interpretation of the region of interest;
   quantify a time for acquiring the at least one MR image; and
   evaluate an MR image value for the MRI protocol based on the outcomes and the time.

2. The system of claim 1, wherein the machine readable instructions stored in the system memory, when executed by the processing unit, cause the processing unit to:
   estimate a cost for acquiring the at least one MR image; and
   evaluate the MR image value based on the outcomes and the cost.

3. The system of claim 1, wherein the machine readable instructions stored in the system memory, when executed by the processing unit, cause the processing unit to acquire at least one of gradient echo, spin echo, fast gradient echo, fast spin echo and their combination with or without magnetization preparation and/or specific tissue suppression.

4. The system of claim 1, wherein the plurality of objective functions comprise at least one of lesion location, lesion border delineation, lesion morphology, contrast or contrast efficiency between lesion tissue and healthy tissue, contrast-to-noise ratio ("CNR") or CNR efficiency between lesion tissue and healthy tissue, signal intensity, signal intensity efficiency, image artifact, image resolution, or total scan.

5. The system of claim 4, wherein the image artifact comprises at least one of susceptibility artifact, geometry distortion, signal inhomogeneity, cross excitation, cross-talk artifact, motion, chemical shift artifact, or contrast agent leakage into healthy tissue.

6. The system of claim 1, wherein the machine readable instructions stored in the system memory, when executed by the processing unit, cause the processing unit to:
   extract quantitative features from the at least one MR image;
   normalize features to unit volume;
   normalize features to unit scan time;
   quantify a cost for acquiring the at least one image; and
   quantify the MR image value based on the outcomes and the cost.

7. The system of claim 6, wherein quantitative features comprise at least one of lesion location, lesion border delineation, lesion morphology, disease stage, lesion geometry metric, contrast or contrast efficiency between lesion tissue and healthy tissue, contrast-to-noise ratio ("CNR") or CNR efficiency between lesion tissue and healthy tissue, signal intensity, signal intensity efficiency, image resolution, total scan time or image artifact.

8. The system of claim 6, wherein the outcomes are qualitative and quantitative.

* * * * *

UNITED STATES PATENT AND TRADEMARK OFFICE
CERTIFICATE OF CORRECTION

| | |
|---|---|
| PATENT NO. | : 11,585,883 B2 |
| APPLICATION NO. | : 17/223164 |
| DATED | : February 21, 2023 |
| INVENTOR(S) | : Jinghua Wang |

It is certified that error appears in the above-identified patent and that said Letters Patent is hereby corrected as shown below:

On the Title Page

Item (74), attorney, agent, or firm, delete "Dinsmore & Shohl" and insert --Dinsmore & Shohl LLP--, therefor.

In the Specification

In Column 5, Line(s) 9, delete "MU" and insert --MRI--, therefor.

In Column 5, Line(s) 19, delete "MU" and insert --MRI--, therefor.

In Column 5, Line(s) 25 - 30, equation 1, delete "deliving" and insert --delivering--, therefor.

In Column 13, Line(s) 30, after "excitation", delete "RE" and insert --RF--, therefor.

In Column 20, Line(s) 14, delete "IR-SPUR" and insert --IR-SPGR--, therefor.

Signed and Sealed this
Second Day of April, 2024

Katherine Kelly Vidal
*Director of the United States Patent and Trademark Office*